US010651041B2

(12) United States Patent
Hsiao et al.

(10) Patent No.: US 10,651,041 B2
(45) Date of Patent: May 12, 2020

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Ru-Shang Hsiao, Hsinchu County (TW); Chi-Cherng Jeng, Tainan (TW); Chih-Mu Huang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/429,595

(22) Filed: Jun. 3, 2019

(65) Prior Publication Data

US 2019/0287806 A1 Sep. 19, 2019

Related U.S. Application Data

(63) Continuation of application No. 15/875,244, filed on Jan. 19, 2018, now Pat. No. 10,312,092, which is a continuation of application No. 14/658,667, filed on Mar. 16, 2015, now Pat. No. 9,892,924.

(51) Int. Cl.
  H01L 21/28 (2006.01)
  H01L 29/423 (2006.01)
  H01L 29/66 (2006.01)
(52) U.S. Cl.
  CPC .. H01L 21/28114 (2013.01); H01L 21/28247 (2013.01); H01L 29/42376 (2013.01); H01L 29/66545 (2013.01)

(58) Field of Classification Search
  CPC combination set(s) only.
  See application file for complete search history.

(56) References Cited

U.S. PATENT DOCUMENTS 8,084,311 B1* 12/2011 Horak ............... H01L 21/76897
                                                       438/183
2011/0147858 A1* 6/2011 Lim .................... H01L 29/4966
                                                       257/412
2011/0156107 A1* 6/2011 Bohr ................. H01L 21/76831
                                                       257/288

* cited by examiner

Primary Examiner — Michelle Mandala
Assistant Examiner — Jordan M Klein
(74) Attorney, Agent, or Firm — WPAT, P.C., Intellectual Property Attorneys; Anthony King

(57) ABSTRACT

A semiconductor structure and a method of forming the same are provided. According to an aspect of the disclosure, a semiconductor structure includes a first layer having a bottom portion and a sidewall connected to the bottom portion, a metal layer disposed above the bottom portion of the first layer, and a second layer disposed above the metal layer and laterally surrounded by the sidewall of the first layer. The metal layer includes a periphery and a middle portion surrounded by the periphery, the middle portion being thicker than the periphery, and a first etch rate of an etchant with respect to the metal layer is uniform throughout the metal layer and is greater than a second etch rate of the etchant with respect to the second layer.

20 Claims, 12 Drawing Sheets

SEMICONDUCTOR STRUCTURE AND MANUFACTURING METHOD THEREOF

PRIORITY CLAIM AND CROSS-REFERENCE

The present application is a Continuation Application claiming the benefit of and priority to U.S. application Ser. No. 15/875,244, filed Jan. 19, 2018, which is a Continuation Application claiming the benefit of and priority to U.S. application Ser. No. 14/658,667, filed Mar. 16, 2015, now U.S. Pat. No. 9,892,924, the entire contents of each of which being incorporated herein by reference.

BACKGROUND

The semiconductor integrated circuit (IC) industry has experienced rapid growth. In the course of IC evolution, functional density (i.e., the number of interconnected devices per chip area) has generally increased while geometric size (i.e., the smallest component (or line) that can be created using a fabrication process) has decreased. This down-scaling process generally provides benefits by increasing production efficiency and lowering associated costs. Such down-scaling has also increased the complexity of processing and manufacturing ICs and, in order to realize these advances, corresponding developments in IC processing and manufacturing are needed. As the dimensions of transistors decrease, the thickness of the gate oxide must be reduced to maintain performance with the decreased gate length. High dielectric constant (high-k) gate insulator layers may be used to reach larger physical thickness while keeping the same effective capacitance provided by other gate insulator layers, such as typical gate oxides.

As technology progresses, in some IC designs, there has been a desire to replace typical poly-silicon gate electrodes with metal gate (MG) electrodes so as to improve device performance. One process of forming the MG electrode is termed "gate last" process, as opposed to another MG electrode formation process termed "gate first." The "gate last" process allows for a reduced number of subsequent processes, including high temperature processing, that must be performed after the formation of gates.

Additionally, it is important to reduce the number of malfunctioning devices per manufactured wafer in order to improve yields.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
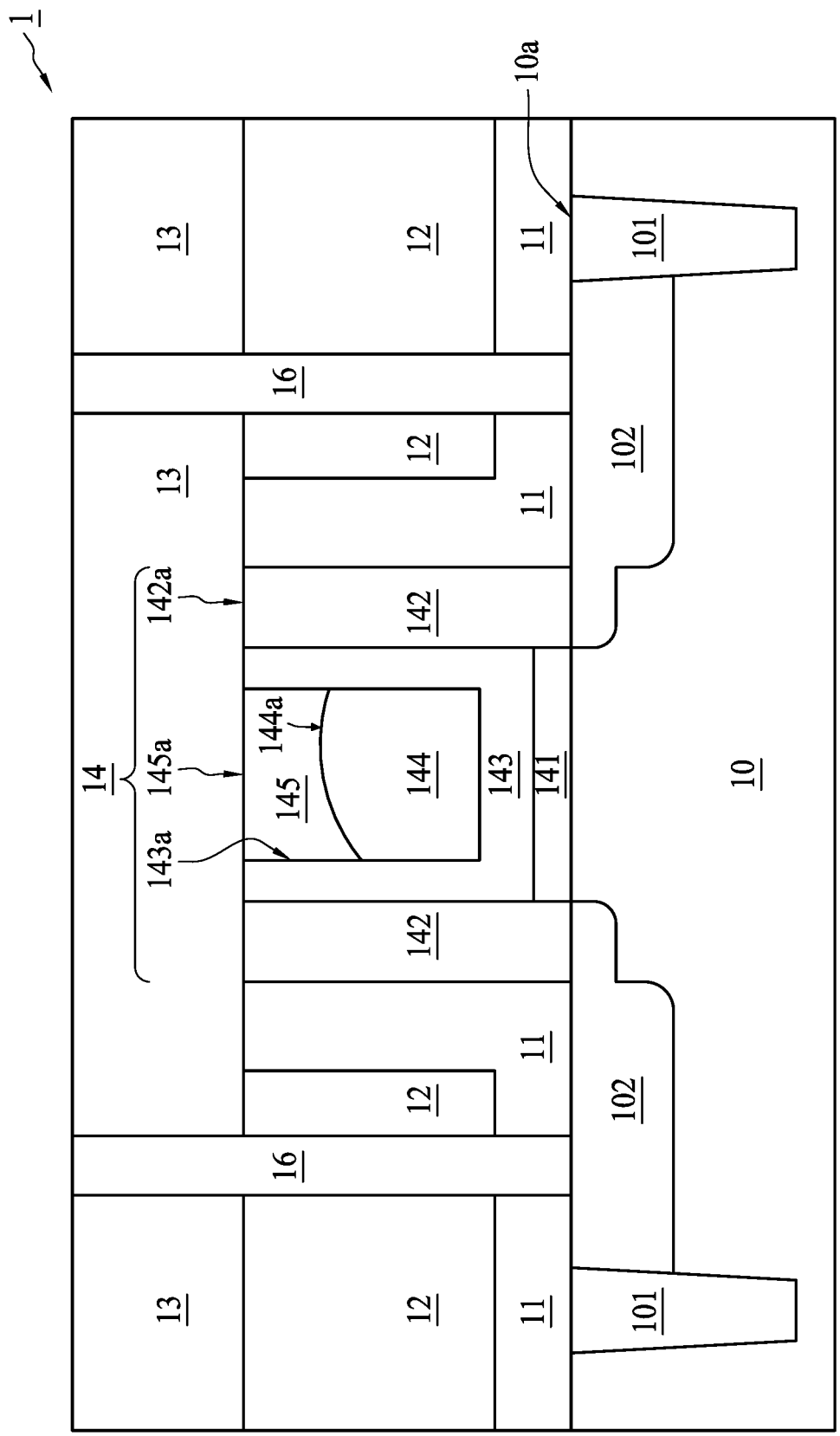
FIG. 1 is a schematic cross-sectional view of a semiconductor structure comprising a gate structure in accordance with some embodiments of the present disclosure.

In the following detailed description, numerous specific details are set forth in order to provide a thorough understanding of the present disclosure. However, it will be understood by those skilled in the art that the present disclosure may be practiced without these specific details. In other instances, well-known methods, procedures, components and circuits are not described in detail so as not to obscure the present disclosure.

Further, the present disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The making and using of the embodiments of the present disclosure are discussed in detail below. It should be appreciated, however, that the provided subject matter provides many applicable inventive concepts that may be embodied in a wide variety of specific contexts. The specific embodiments discussed herein are merely illustrative and do not limit the scope of the provided subject matter.

FIG. 1 illustrates the cross-sectional view of a semiconductor structure 1 in accordance with some embodiments of the present disclosure. The semiconductor structure 1 comprises a semiconductor layer 10, which comprises a surface 10a. The semiconductor structure 1 may comprise one or more isolation regions 101 and one or more source/drain regions 102. The semiconductor structure 1 may comprise other parts on or above the surface 10a of the semiconductor layer 10, such as interlayer dielectric (ILD) layers 12, 13 and an etch stop layer (ESL) 11. In some embodiments, the ILD layer 13 may be in contact with at least a portion of the ILD layer 12. The semiconductor structure 1 may also comprise a gate structure 14, which may comprise, among others, a gate dielectric layer 141, a spacer 142, an intermediate layer 143, a metal layer 144 and a protection layer 145. At least one contact 16 may be formed above the source/drain region 102. In some embodiments, the contact 16 electrically connects the source/drain region 102 to circuit elements external to the semiconductor structure 1.

The semiconductor layer 10 may comprise a crystalline silicon substrate (e.g., wafer) in accordance with some embodiments of the present disclosure. The semiconductor layer 10 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or any suitable combinations thereof. The doped regions may be configured for an n-type FinFET or planar MOSFET, or alternatively configured for a p-type FinFET or planar MOSFET. Various other layers may be formed on the semiconductor layer 10, such as dielectric layers, doped layers, poly-silicon layers and/or conductive layers. Various devices may also be formed on the semiconductor layer 10, such as transistors, resistors, and/or capacitors. These devices may be interconnected through an interconnect layer to other circuit elements that may be part of one or more integrated circuits.

As illustrated in FIG. 1, one or more isolation regions 101 may be formed in the semiconductor layer 10 in order to define and electrically isolate various parts of the semiconductor structure 1. In some embodiments, the isolation regions 101 may be shallow trench isolation (STI) regions. The isolation regions may comprise silicon oxide, silicon nitride, silicon oxynitride, fluoride-doped silicate glass (FSG), a low-K dielectric material, and/or any suitable combinations thereof. The isolation regions 101 (or the STI regions, as the case may be in some embodiments) may be formed by any suitable processes. In one embodiment, the formation of the isolation regions 101 may include filling trenches in the semiconductor structure 1 (for example, by a chemical vapor deposition (CVD) process) with a dielectric material. In some embodiments, the filled trench may have a multi-layer structure such as a thermal oxide liner layer filled with silicon nitride or silicon oxide.

The source/drain region 102 may comprise a silicon-containing material, such as SiGe, SiC, or SiP. In some embodiments, the source/drain region 102 may be formed by doping the semiconductor structure 1 with desired amounts of any suitable dopants. In some embodiments, the source/drain region 102 may be formed by epitaxy. Although the source/drain region 102 as illustrated in FIG. 1 is under the surface 10a of the semiconductor structure 1, a portion of the source/drain region 102 may be above the surface 10a in accordance with some embodiments of the present disclosure. In some embodiments, the amount of doping in the source/drain region 102 may be uniform. In some embodiments, the amount of doping in the source/drain region 102 may be different in different parts of the source/drain region 102; for example, a portion of the source/drain region 102 may be a lightly doped source/drain (LDD) region. In some embodiments, the edge of the source/drain region 102 may be aligned with the edge of the spacer 142. In some embodiments, the edge of the source/drain region 102 may not be aligned with the edge of the spacer 142. Similarly, the edge of the source/drain region 102 may or may not be aligned with the edge of the gate dielectric layer 141 in different embodiments of the present disclosure. A channel region may be formed between the source/drain regions 102 under the gate structure 14 of the semiconductor structure 1.

The ESL 11 may be formed over the semiconductor structure 1, as illustrated in FIG. 1. The ESL 11 may be formed by any suitable process, such as film deposition. In some embodiments, the ESL 11 may comprise silicon nitride, silicon oxynitride, other suitable materials, and/or combinations thereof. In some embodiments, the ESL 11 may be a contact etch stop layer (CESL) comprising silicon nitride.

The ILD layer 12 may be above a portion of the ESL 11. Another ILD layer 13 may be formed above some other portions of the ESL 11, the ILD layer 12 and/or the gate structure 14, as illustrated in FIG. 1. In some embodiments, a portion of the ILD layer 13 is in contact with the ESL 11, the ILD layer 12, the spacer 142, the intermediate layer 143 and/or the protection layer 145. The ILD layers 12, 13 may comprise a dielectric material. The dielectric material may comprise silicon oxide, silicon nitride, silicon oxynitride, spin-on glass (SOG), fluorinated silica glass (FSG), carbon doped silicon oxide (e.g., SiCOH), BLACK DIAMOND® (Applied Materials of Santa Clara, Calif.), XEROGEL®, AEROGEL®, amorphous fluorinated carbon, Parylene, BCB (bis-benzocyclobutenes), FLARE®, SILK® (Dow Chemical, Midland, Mich.), polyimide, other proper porous polymeric materials, other suitable dielectric materials, and/or combinations thereof. In some embodiments, the ILD layers 12, 13 may include a high density plasma (HDP) dielectric material (e.g., HDP oxide) and/or a high aspect ratio process (HARP) dielectric material (e.g., HARP oxide). The ILD layers 12, 13 may comprise any suitable thickness. In some embodiments, the ILD layers 12, 13 may each comprise a thickness of about 10 Å to 100 Å. The ILD layer 13 may comprise one or more dielectric materials and/or one or more dielectric layers.

At least one contact 16 may exist in the semiconductor structure 1 so as to electrically connect the source/drain region 102 to circuit elements external to the semiconductor structure 1. In some embodiments, the contact 16 may be in contact with a portion of the ESL 11, the ILD layer 12 and/or the ILD layer 13. The contact 16 may comprise suitable materials, such as metals, metal compounds, metal alloys and/or other electrically conductive materials. In some embodiments, the contact 16 may comprise one or more materials and/or one or more layers. The contact 16 may be formed by any suitable processes, including but not limited to chemical vapor deposition (CVD), physical vapor deposition (PVD) and atomic layer deposition (ALD).

Still referring to FIG. 1, the gate structure 14 of the semiconductor structure 1 may comprise, among others, a gate dielectric layer 141, a spacer 142, an intermediate layer 143, a metal layer 144 and a protection layer 145. The location of the gate structure 14 may be at least partially defined by the locations of other parts of the semiconductor structure 1, such as the locations of the ESL 11 and the ILD layer 12.

Although the gate dielectric layer 141 is illustrated in FIG. 1, the gate dielectric layer 141 may be optional in accordance with some embodiments of the present disclosure. In some embodiments, the gate dielectric layer 141 may comprise silicon oxide, silicon oxynitride, a high-k dielectric layer and/or combinations thereof. The gate dielectric layer 141 may further comprise an interfacial layer to reduce damages between the gate dielectric layer 141 and the semiconductor layer 10. The interfacial layer may comprise silicon oxide. The gate dielectric layer 141 may be formed by any suitable process.

The gate structure 14 may additionally comprise one or more spacers 142. In some embodiments, the spacers 142 may surround at least a portion of the gate dielectric layer 141. The spacers 142 may be formed using any suitable process to any suitable thickness, including the processes described herein. The spacers 142 may comprise a dielectric material such as silicon nitride, silicon oxide, silicon carbide, silicon oxynitride, other suitable materials, and/or combinations thereof. In some embodiments, the spacers 142 may comprise a multilayer structure. The spacers 142 may help define the location of the gate structure 14 in the semiconductor structure 1. In some embodiments of the present disclosure, the top surface 142a of the spacer 142 may be substantially coplanar with the top surface of the ESL 11 and/or the ILD layer 12. In some embodiments, the top surface 142a of the spacer 142 may be in contact with a portion of the ILD layer 13.

Still referring to FIG. 1, an intermediate layer 143 may be formed above the semiconductor layer 10 and/or the gate dielectric layer 141. In some embodiments, the intermediate layer 143 may be in contact with the gate dielectric layer 141 and/or the spacers 142. In some embodiments, the top surface of the intermediate layer 143 may be substantially coplanar with the top surface of the ESL 11, the ILD layer 12 and/or the spacer 142. The intermediate layer 143 comprises a surface 143a. In some embodiments, the surface 143a may be recessed. In some embodiments, the top surface of the intermediate layer 143 may be in contact with a portion of the ILD layer 13.

In some embodiments of the present disclosure, the intermediate layer 143 may comprise one or more materials and/or one or more layers. For example, the intermediate layer 143 may comprise a dielectric layer, a high-K dielectric layer, a barrier layer, and/or a work function layer. The dielectric layer may comprise silicon oxide, silicon nitride, silicon oxynitride, polyimide, other suitable dielectric materials, and/or combinations thereof. The high-k dielectric layer may comprise hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof. In some embodiments, the barrier layer may comprise TiN, TiCN, TaN, TaCN, WN and/or WCN. In some embodiments, the work function layer may comprise metal carbonitride, metal silicon nitride, metal aluminide, TiSiN, TiAlN, TiAl, TaAl, other suitable materials, and/or combinations thereof. The dielectric layer, the high-K dielectric layer, the barrier layer, and/or the work function layer may be formed by suitable processes, comprising at least ALD, PVD, CVD and plasma-enhanced chemical vapor deposition (PECVD).

Still referring to FIG. 1, a metal layer 144 may be above a portion of the recessed surface 143a of the intermediate layer 143. In some embodiments of the present disclosure, at least a portion of the metal layer 144 is surrounded by the intermediate layer 143. The metal layer 144 may comprise a top surface 144a. The metal layer 144 may comprise single metals, such as Al, W, WN, TaN, and Ru; metal compounds, such as TaN, TiN, W, WN, and WCN; other suitable materials; and/or combinations thereof. In some embodiments, the metal layer 144 may comprise one or more layers. The metal layer 144 may be formed by any suitable processes, including but not limited to CVD and PVD.

Still referring to FIG. 1, a protection layer 145 may be above at least a portion of the metal layer 144. In some embodiments of the present disclosure, at least a portion of the protection layer 145 is surrounded by the intermediate layer 143. In some embodiments, the protection layer 145 comprises a top surface 145a that may be substantially coplanar with the top surface of the ESL 11 and/or the ILD layer 12. In some embodiments, a portion of the top surface 145a of the protection layer 145 may be higher or lower than the top surface of the ESL 11 and/or the ILD layer 12. In some embodiments, the top surface 145a of the protection layer 145 may be substantially coplanar with the top surface 142a of the spacer 142 and/or the top surface of the intermediate layer 143. In some embodiments, the top surface 145a of the protection layer 145 may be higher or lower than the top surface 142a of the spacer 142 and/or the top surface of the intermediate layer 143. The protection layer 145 may comprise metal oxides such as $Al_xO_y$, $W_xO_y$, other suitable materials and/or combinations thereof. In some embodiments, the protection layer 145 is an oxide compound of the material of the metal layer 144.

In some embodiments, the protection layer 145 may have an etch rate that is different from the etch rate of the metal layer 144 with respect to a particular etchant used in various processes. In some embodiments of the present disclosure, the etchant may include abrasive, surfactant, organic KOH, $NH_4OH$, or other etchants with suitable selectivity between the protection layer 145 and the metal layer 144. With respect to a given etchant, the etch rate of the protection layer 145 is lower than the etch rate of the metal layer 144. In some embodiments of the present disclosure, the ratio of the etch rate of the protection layer 145 to the etch rate of the metal layer 144 with respect to the given etchant may be in a range of from about 1/10 to about 1/100.

Figure 2A:
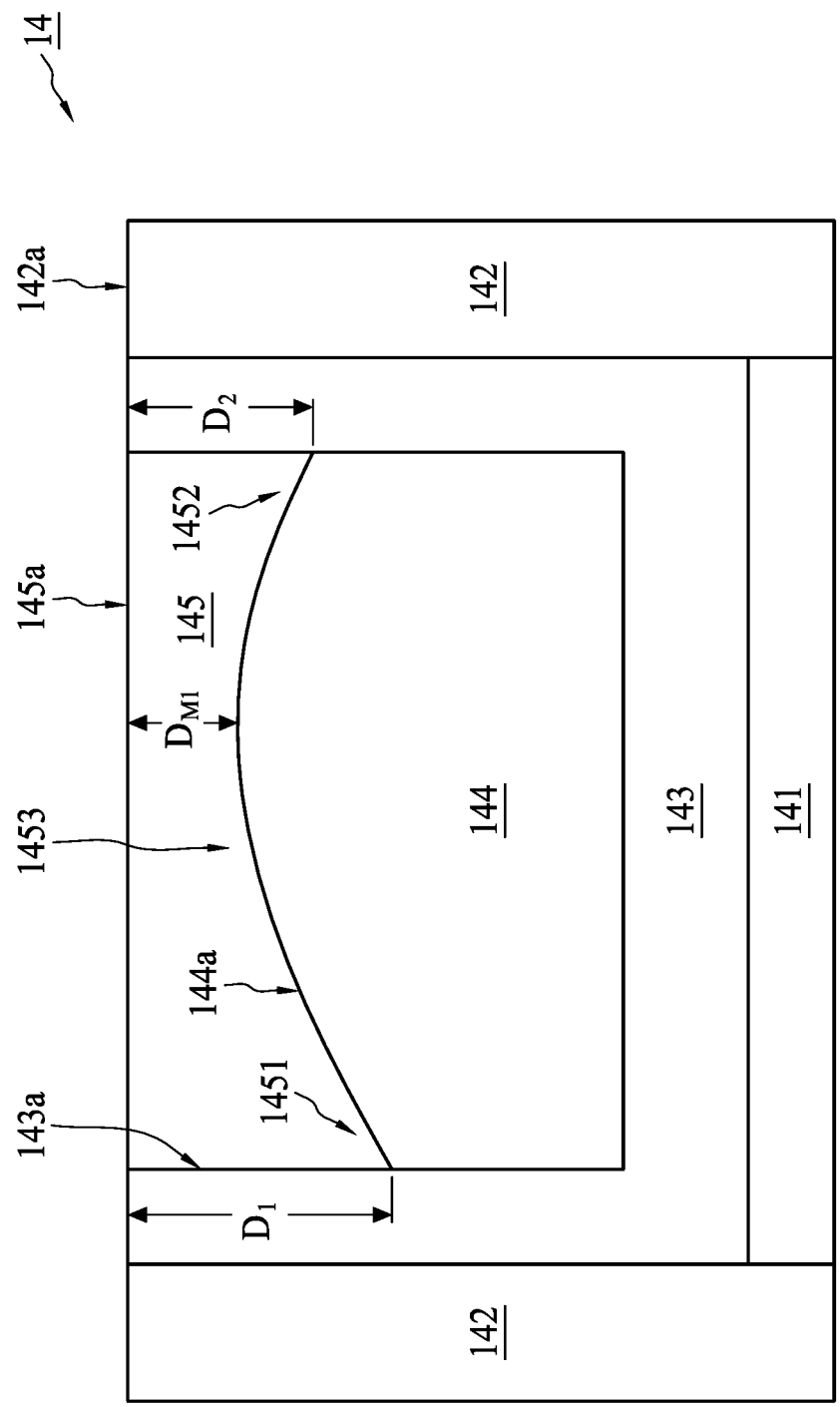
FIG. 2A is a schematic cross-sectional view of the gate structure of the semiconductor structure illustrated in FIG. 1 in accordance with some embodiments of the present disclosure.

FIG. 2A illustrates an enlarged cross-sectional view of a gate structure 14 of a semiconductor structure 1 in accordance with some embodiments of the present disclosure. The gate structure 14 may comprise a gate dielectric layer 141, a spacer 142, an intermediate layer 143, a metal layer 144 and a protection layer 145. The intermediate layer 143 comprises a surface 143a that may be recessed. The protection layer 145 may comprise a top surface 145a, a lateral side 1451, a lateral side 1452 and a middle part 1453.

Different parts of the protection layer 145 may have different thicknesses. In some embodiments of the present disclosure, the protection layer 145 has a thickness of $D_1$ at the lateral side 1451, a thickness of $D_2$ at the lateral side 1452, and a thickness of $D_{M1}$ at the middle part 1453. In some embodiments, $D_1$ may be greater than $D_{M1}$. In some embodiments, $D_2$ may be greater than $D_{M1}$. In some embodiments, both $D_1$ and $D_2$ may be greater than $D_{M1}$. In some embodiments, $D_1$ may be greater than or less than $D_2$. The amount by which $D_1$ is greater than $D_{M1}$ may be variable. In some embodiments, $D_1$ may be greater than $D_{M1}$ by a range of from about 10% to about 500%. The amount by which $D_2$ is greater than $D_{M1}$ may also be variable. In some embodiments, $D_2$ may be greater than $D_{M1}$ by a range of from about 10% to about 500%. In some embodiments, $D_1$ may be between 1 Å and 500 Å. In some embodiments, $D_2$ may be between 1 Å and 500 Å. In some embodiments, $D_{M1}$ may be between 1 Å and 100 Å.

Figure 2B:
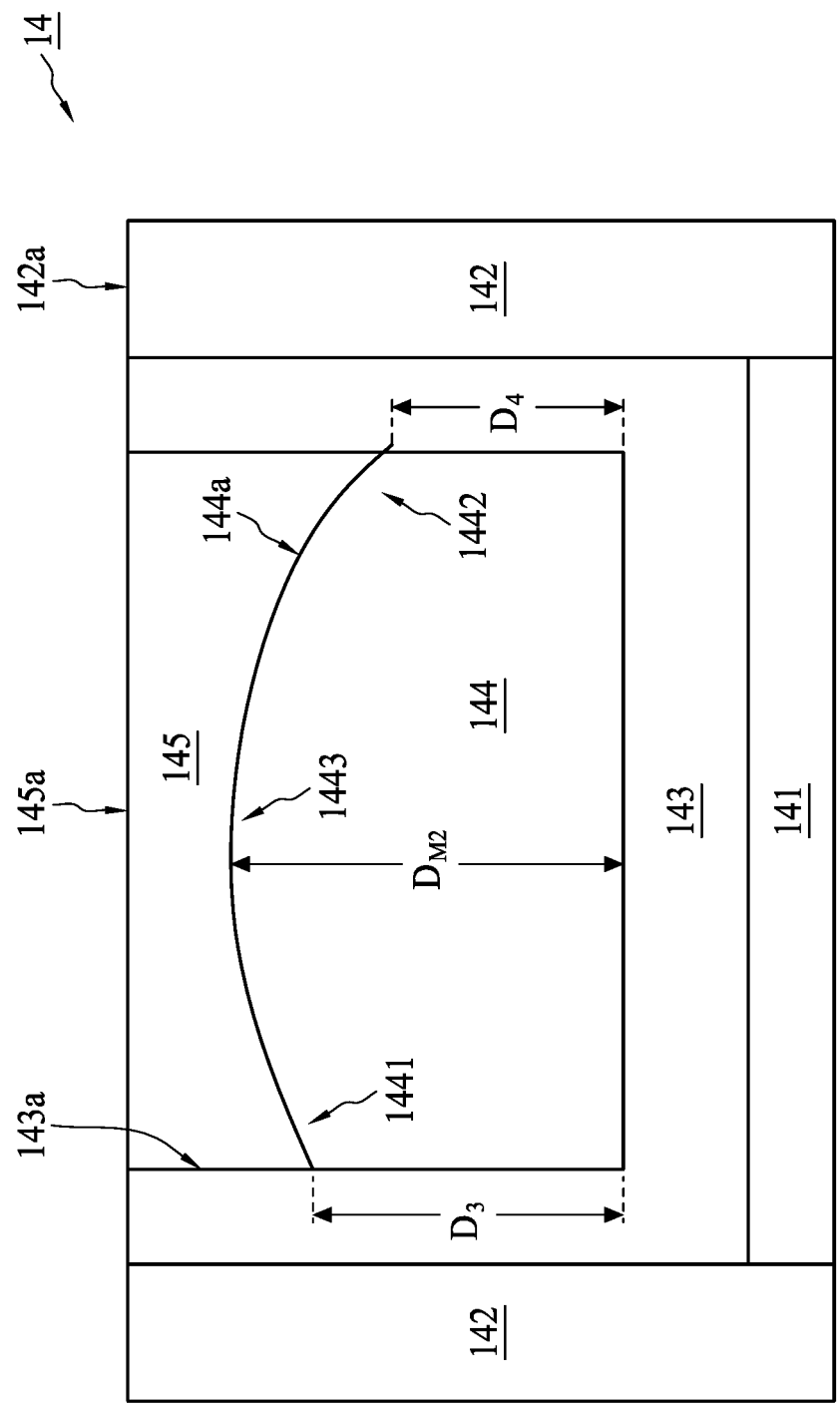
FIG. 2B is a schematic cross-sectional view of another gate structure of the semiconductor structure in accordance with some embodiments of the present disclosure.

FIG. 2B illustrates an enlarged cross-sectional view of a gate structure 14 of a semiconductor structure 1 in accordance with some embodiments of the present disclosure. The gate structure 14 may comprise a gate dielectric layer 141, a spacer 142, an intermediate layer 143, a metal layer 144 and a protection layer 145. The intermediate layer 143 comprises a surface 143a that may be recessed. The metal layer 144 may comprise a top surface 144a, a lateral side 1441, a lateral side 1442 and a middle part 1443.

Different parts of the metal layer 144 may have different thicknesses. In some embodiments of the present disclosure, the metal layer 144 has a thickness of $D_3$ at the lateral side 1441, a thickness of $D_4$ at the lateral side 1442, and a thickness of $D_{M2}$ at the middle part 1443. In some embodiments, $D_3$ may be less than $D_{M2}$. In some embodiments, $D_4$ may be less than $D_{M2}$. In some embodiments, both $D_3$ and $D_4$ may be less than $D_{M2}$. In some embodiments, $D_3$ may be greater than or less than $D_4$. The amount by which $D_3$ is less than $D_{M2}$ may be variable. In some embodiments, $D_3$ may be less than $D_{M2}$ by a range of from about 5% to about 90% of $D_{M2}$. The amount by which $D_4$ is less than $D_{M2}$ may also be variable. In some embodiments, $D_4$ may be less than $D_{M2}$ by a range of from about 5% to about 90% of $D_{M2}$. In some embodiments, $D_3$ may be between 200 Å and 500 Å. In some embodiments, $D_4$ may be between 200 Å and 500 Å. In some embodiments, $D_{M2}$ may be between 201 Å and 1000 Å.

In some embodiments of the present disclosure, the metal layer 144 and the protection layer 145 may be separated by other layers that are not illustrated in the figures. In some embodiments, the metal layer 144 and the protection layer 145 may be in contact with each other as illustrated in FIGS. 2A and 2B, where a bottom surface of the protection layer 145 is in contact with a top surface 144a of the metal layer 144. In some embodiments in which the metal layer 144 is in contact with the protection layer 145, the sum of the thickness of the metal layer 144 at the lateral side 1441 and the thickness of the protection layer 145 at the lateral side 1451 may be substantially equal to the sum of the thickness of the metal layer 144 at the lateral side 1442 and the thickness of the protection layer 145 at the lateral side 1452. In some embodiments in which the metal layer 144 is in contact with the protection layer 145, the sum of the thickness of the metal layer 144 at the lateral side 1441 and the thickness of the protection layer 145 at the lateral side 1451 may be substantially equal to the sum of the thickness of the metal layer 144 at the middle part 1443 and the thickness of the protection layer 145 at the middle part 1453. In some embodiments in which the metal layer 144 is in contact with the protection layer 145, the sum of the thickness of the metal layer 144 at the lateral side 1442 and the thickness of the protection layer 145 at the lateral side 1452 may be substantially equal to the sum of the thickness of the metal layer 144 at the middle part 1443 and the thickness of the protection layer 145 at the middle part 1453.

Since the protection layer 145 is thicker at the lateral side 1451 ($D_1$) and/or the lateral side 1452 ($D_2$) than at the middle part 1453 ($D_{M1}$), a greater portion of the protection layer 145 at the lateral side 1451 and/or lateral side 1452 may be etched away without exposing the metal layer 144. Therefore, it is more likely that the protection layer 145 will protect the metal layer 144 and prevent the metal layer 144 from being undesirably etched away by etchants in the current and/or subsequent manufacturing process steps, thereby increasing the number of functional devices on a given semiconductor wafer and improving the production yield.

FIGS. 3A-3I are schematic cross-sectional views of a semiconductor structure comprising a gate structure at various stages of fabrication in accordance with some embodiments of the present disclosure.

Figure 3A:
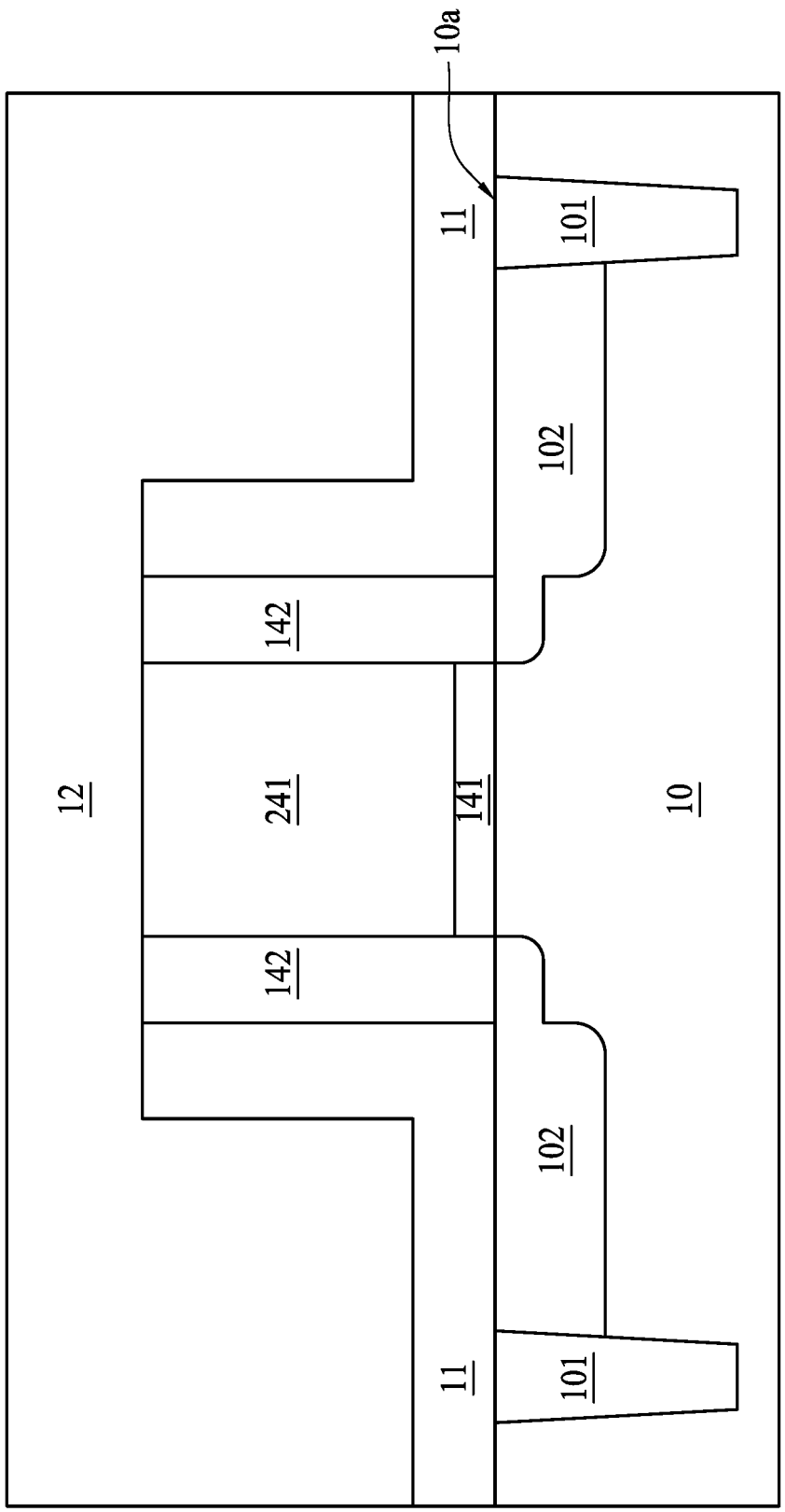
FIGS. 3A-3I are schematic cross-sectional views of a semiconductor structure comprising a gate structure at various stages of fabrication in accordance with some embodiments of the present disclosure.

Referring to FIG. 3A, a semiconductor layer 10 with a surface 10a, at least one isolation region 101 and at least one source/drain region 102 is provided. An etch stop layer (ESL) 11 and a spacer 142 may also be provided above the surface 10a. In some embodiments, a portion of the source/drain region 102 may be above the surface 10a. In some embodiments, an optional gate dielectric layer 141 may be provided on the surface 10a. A dummy gate 241 may be provided above the (optional) gate dielectric layer 141 and at least partially surrounded by the spacer 142. An interlayer dielectric (ILD) layer 12 may be formed above the ESL 11, the spacer 142 and/or the dummy gate 241. In some embodiments, the ILD layer 12 may be in contact with at least one of the ESL 11, the spacer 142 and the dummy gate 241.

The dummy gate 241 may comprise a single layer or multilayer structure in accordance with some embodiments of the present disclosure. The dummy gate 241 may comprise poly-silicon and/or other suitable materials. In some embodiments, the dummy gate 241 may be doped poly-silicon.

Figure 3B:
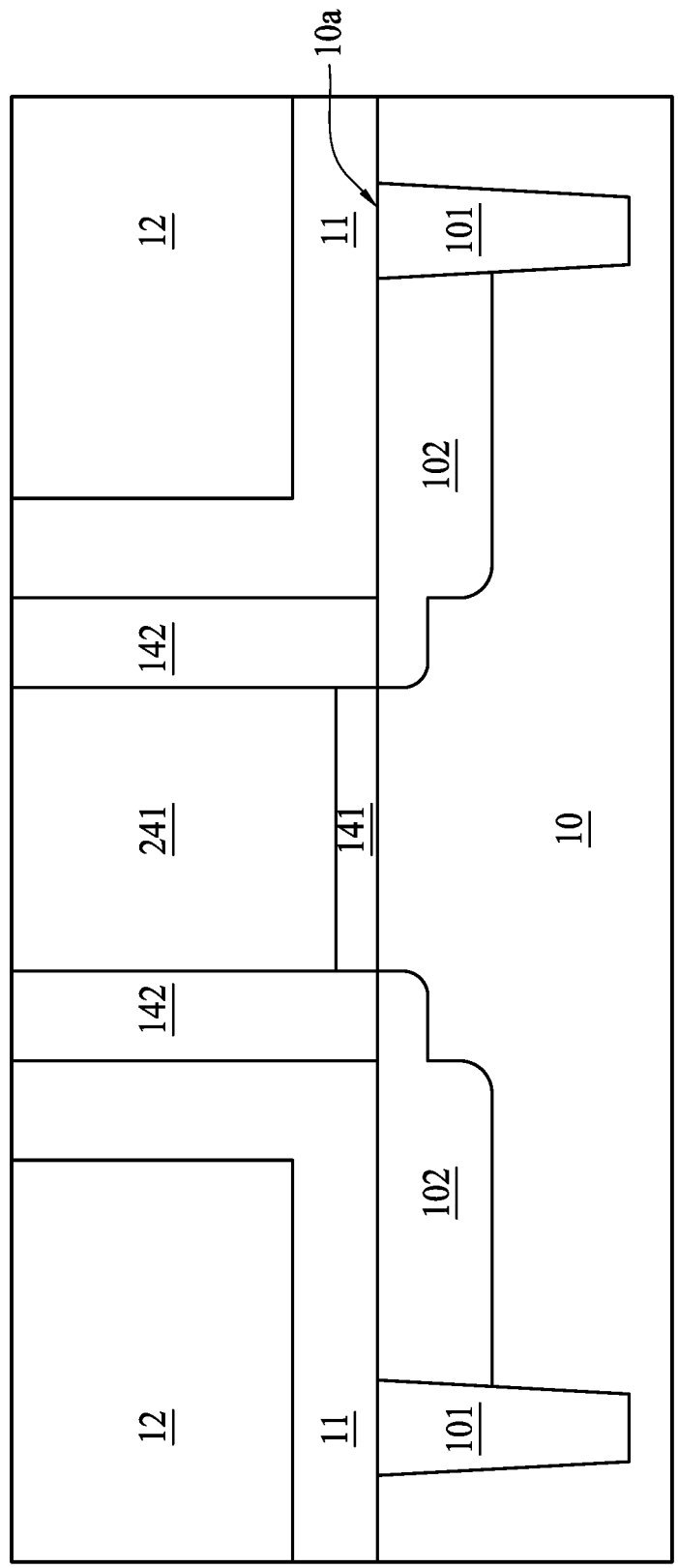

Referring to FIG. 3B, the ILD layer 12 is planarized to expose a surface of the dummy gate 241. The planarization of the ILD layer 12 may also expose a surface of the spacer 142. In some embodiments, the dummy gate 241 is at least partially surrounded by the spacer 142, the ESL 11 and the ILD layer 12 after the planarization of the ILD layer 12. In some embodiments, the ILD layer 12 is planarized in such a way that the top surface of the dummy gate 241 is substantially coplanar with the top surface of at least one of the spacer 142, a portion of the ESL 11 and a portion of the ILD layer 12. The planarization may be achieved by a chemical-mechanical-polishing (CMP) process and/or any other suitable processes.

Figure 3C:
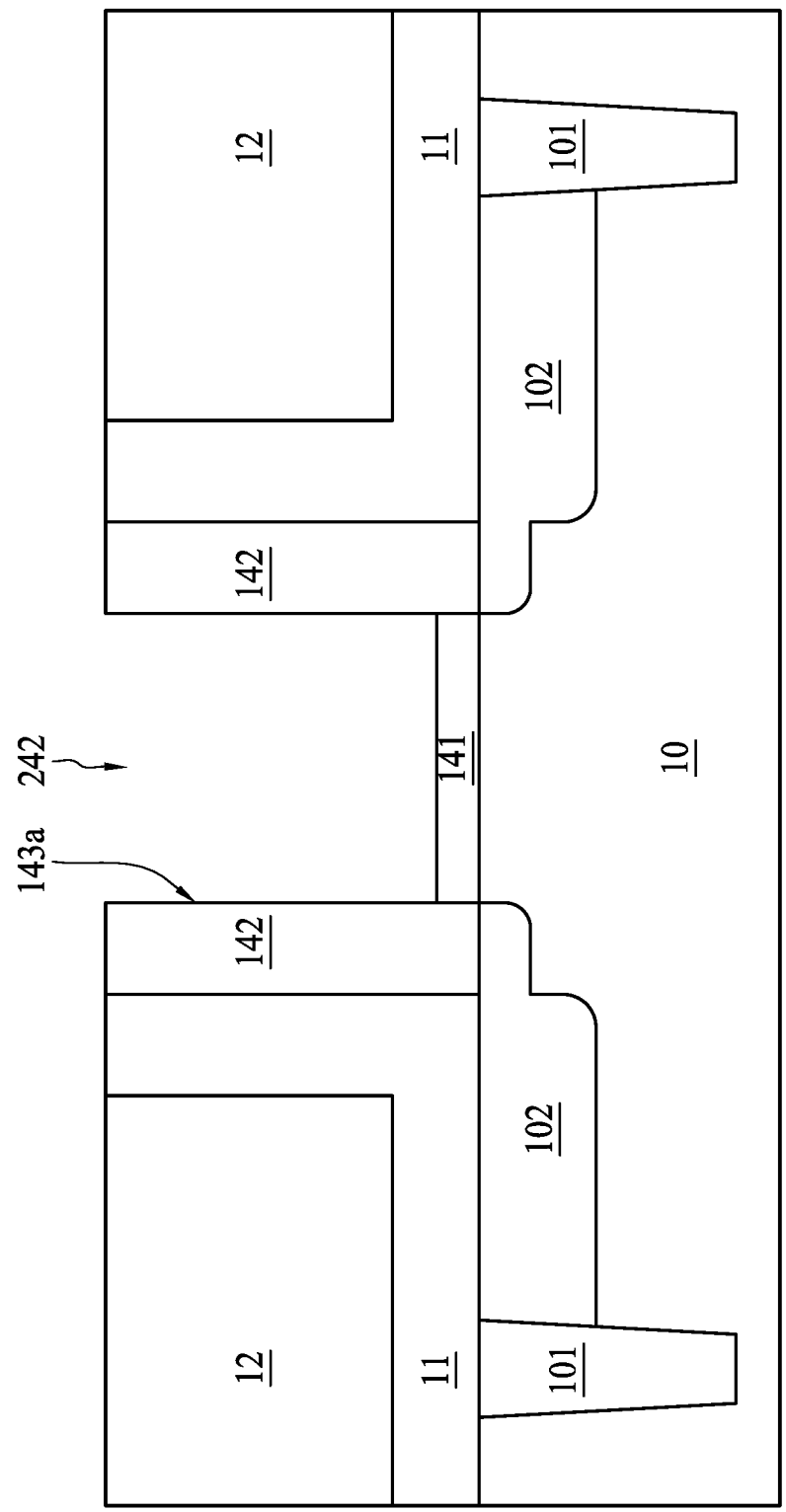

Referring to FIG. 3C, after the planarization of the ILD layer 12, the dummy gate 241 is removed to form a recess 242. The dummy gate 241 may be removed by a wet etch process, a dry etch process, other suitable processes and/or combinations thereof. In an embodiment, the wet etch process for a dummy gate 241 that comprises poly-silicon includes exposure to a hydroxide containing solution (e.g., ammonium hydroxide and tetramethylammonium hydroxide), deionized water, and/or other suitable etchant solutions.

In some embodiments of the present disclosure, the etchant for the dummy gate 241 will either not etch or only slightly etches the gate dielectric layer 141, thereby preventing the region of the semiconductor layer 10 under the gate dielectric layer 141 from being undesirably etched. In some embodiments, the etch rate of the dummy gate 241 to the gate dielectric layer 141 may be 5:1, 10:1, 15:1, 20:1 or higher.

Figure 3D:
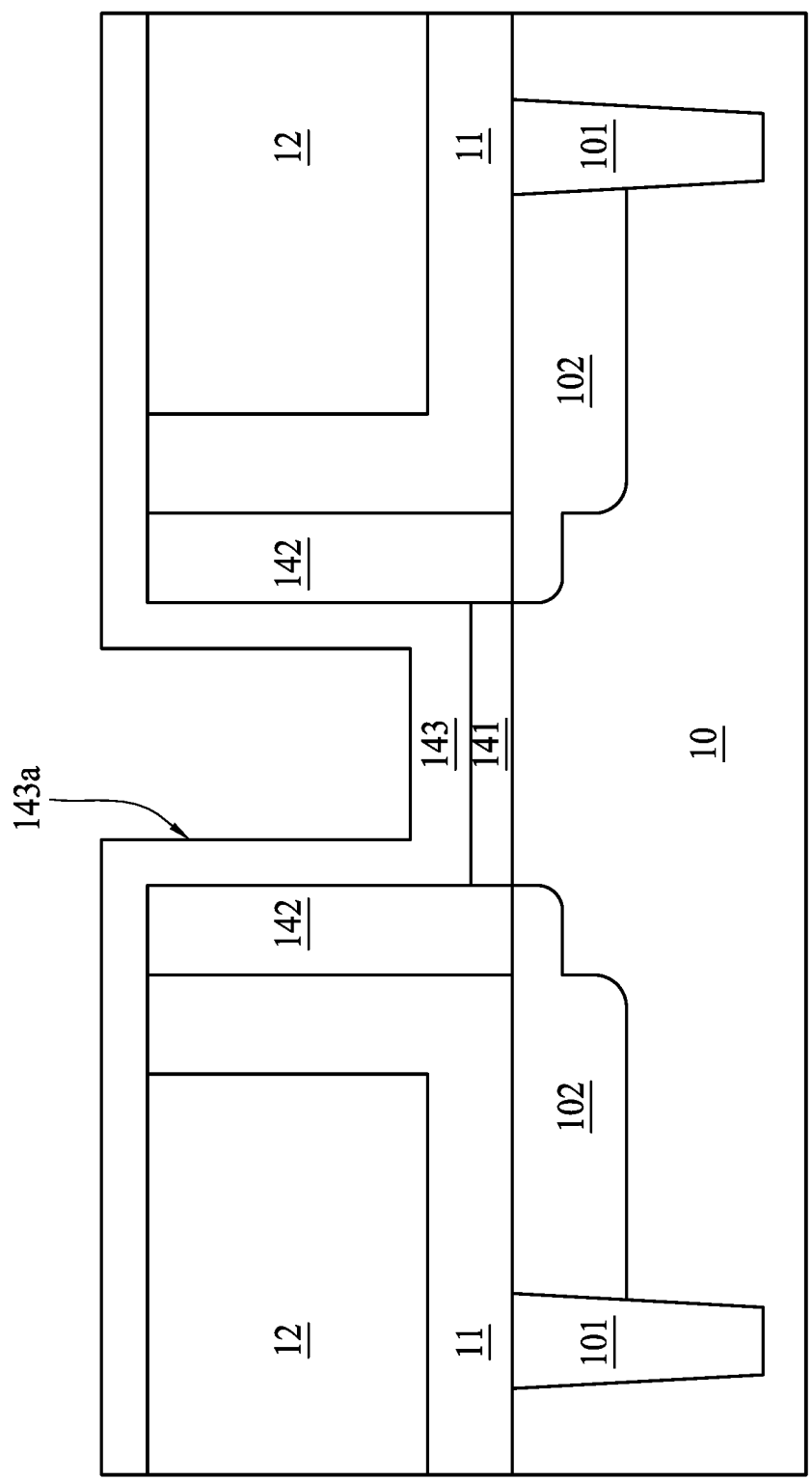

Referring to FIG. 3D, after the dummy gate 241 is removed, an intermediate layer 143 may be formed above at least a portion of the gate dielectric layer 141. The intermediate layer 143 may have a surface 143a that is recessed. In some embodiments, the intermediate layer 143 partially fills the recess 242. In some embodiments, the intermediate layer 143 may cover at least a portion of the ESL 11, the ILD layer 12 and/or the spacer 142.

In some embodiments of the present disclosure, the intermediate layer 143 may comprise one or more materials and/or one or more layers. For example, the intermediate layer 143 may comprise a dielectric layer, a high-K dielectric layer, a barrier layer, and/or a work function layer. The dielectric layer may comprise silicon oxide, silicon nitride, silicon oxynitride, polyimide, other suitable dielectric materials, and/or combinations thereof. The high-k dielectric layer may comprise hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon nitride, silicon oxynitride, zirconium oxide, titanium oxide, aluminum oxide, hafnium dioxide-alumina (HfO$_2$—Al$_2$O$_3$) alloy, other suitable high-k dielectric materials, and/or combinations thereof. In some embodiments, the barrier layer may comprise TiN, TiCN, TaN, TaCN, WN and/or WCN. In some embodiments, the work function layer may comprise metal carbonitride, metal silicon nitride, metal aluminide, TiSiN, TiAlN, TiAl, TaAl, other suitable materials, and/or combinations thereof. The dielectric layer, the high-K dielectric layer, the barrier layer, and/or the work function layer may be formed by suitable processes, comprising at least ALD, PVD, CVD and PECVD.

The intermediate layer 143 may be formed by any suitable method or processes. In some embodiments, the intermediate layer 143 may be formed by deposition or thermal growth.

Figure 3E:
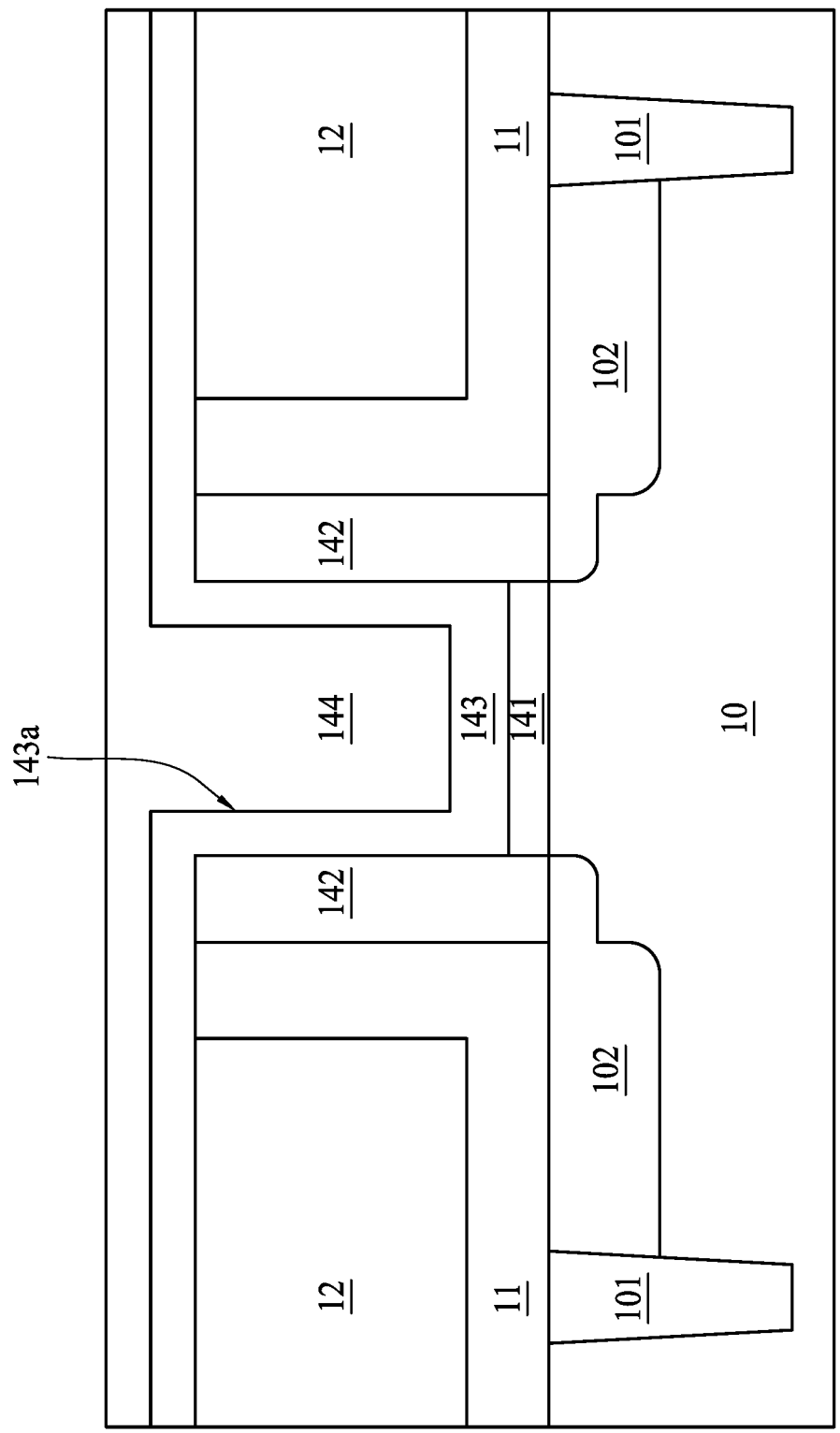

Referring to FIG. 3E, a metal layer 144 is formed after the formation of the intermediate layer 143 so that the recess 242 is filled. The metal layer 144 may comprise single metals, such as Al, W, WN, TaN, and Ru; metal compounds, such as TaN, TiN, W, WN, and WCN; other suitable materials; and/or combinations thereof. In some embodiments, the metal layer 144 may comprise one or more layers. The metal layer 144 may be formed by any suitable processes, including but not limited to CVD and PVD. In some embodiments, the metal layer 144 may cover at least a portion of the surface 143a of the intermediate layer 143. In some embodiments, the metal layer 144 may substantially fill the recess 242.

Figure 3F:
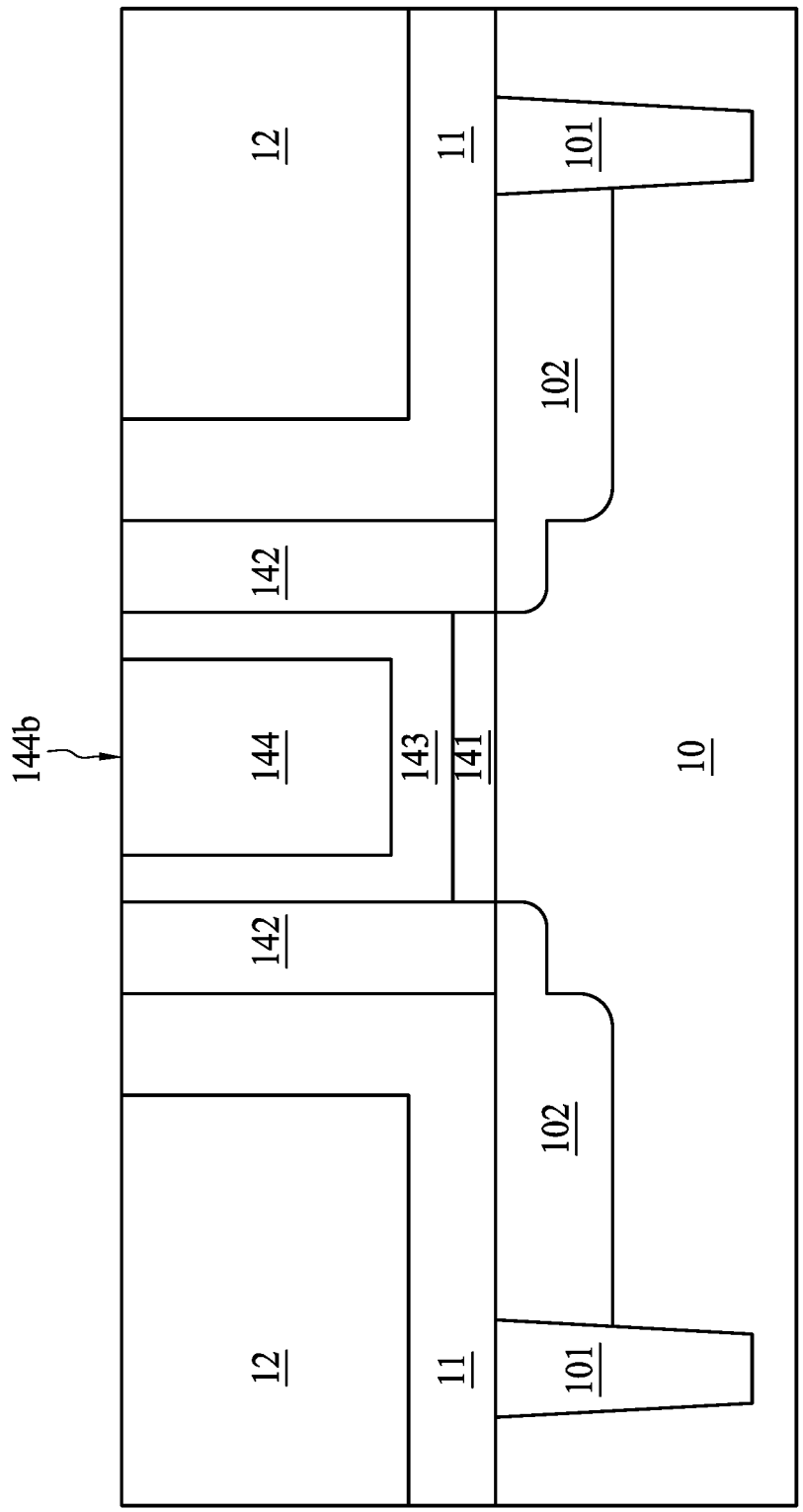

Referring to FIG. 3F, the metal layer 144 may be planarized to expose a surface of the ESL 11, the ILD layer 12, the spacer 142 and/or the intermediate layer 143. In some embodiments, the top surface 144b of the metal layer 144 may be so planarized as to be substantially coplanar with the top surface of a portion of the ESL 11, the ILD layer 12, the spacer 142 and/or a portion of the intermediate layer 143. The planarization may be achieved by a CMP process and/or any other suitable processes.

Figure 3G:
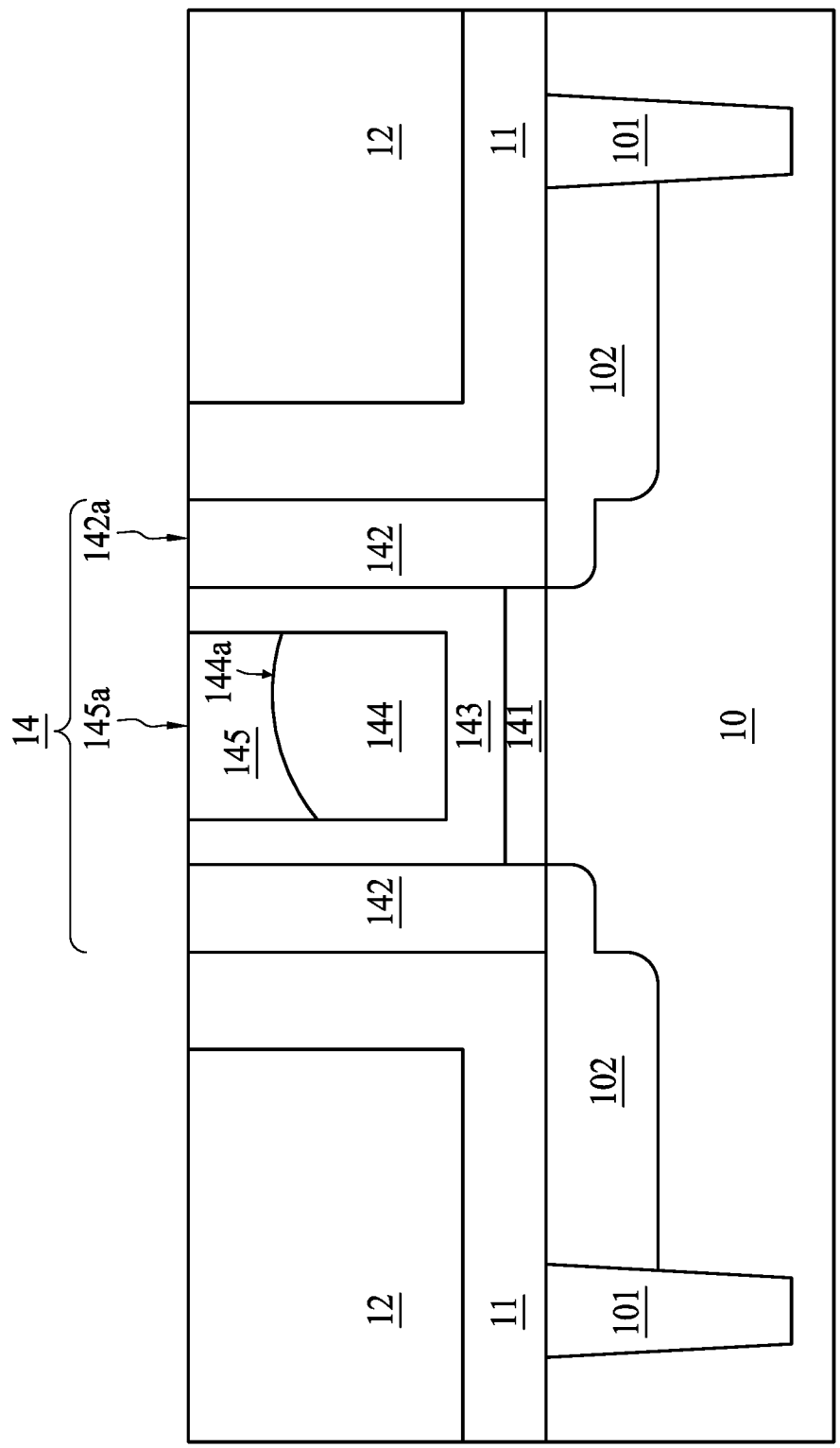

Referring to FIG. 3G, a protection layer 145 may be formed after the formation of the metal layer 144. The protection layer 145 may be above the metal layer 144. In some embodiments of the present disclosure, the protection layer 145 may be formed in such a way that the protection layer 145 and the metal layer 144 come into contact. In some embodiments, the metal layer 144 may comprise a non-uniform thickness after the formation of the protection layer 145. In some embodiments, the top surface 145a of the protection layer 145 may be so formed as to be substantially coplanar with the top surface of a portion of the ESL 11, the ILD layer 12, the spacer 142 and/or a portion of the intermediate layer 143. After the formation of the protection layer 145, a gate structure 14 comprising the gate dielectric layer 141, the spacer 142, the intermediate layer 143, the metal layer 144 and the protection layer 145 is also formed. The gate structure 14 so formed may be similar to the gate structure 14 illustrated in FIG. 2A or 2B.

In some embodiments of the present disclosure, the protection layer 145 may be formed by subjecting the top surface 144b of the metal layer 144 to a treatment after the planarization of the metal layer 144. In some embodiments, the treatment may comprise causing a chemical reaction in at least a portion of the metal layer 144. In some embodiments, the treatment may comprise oxidizing at least a portion of the metal layer 144 and/or other suitable processes. In some embodiments, the treatment may comprise integrated metrology close-loop control (IMCLC).

In some embodiments of the present disclosure, the protection layer 145 may comprise metal oxides such as Al$_x$O$_y$, W$_x$O$_y$, other suitable materials and/or combinations thereof. In some embodiments, the rate at which the protection layer 145 is etched is different from the rate at which the metal layer 144 is etched. In some embodiments, the ratio of the etch rate of the protection layer 145 to the etch rate of the metal layer 144 with respect to a given etchant may be in a range of from about 1/10 to about 1/100.

Figure 3H:
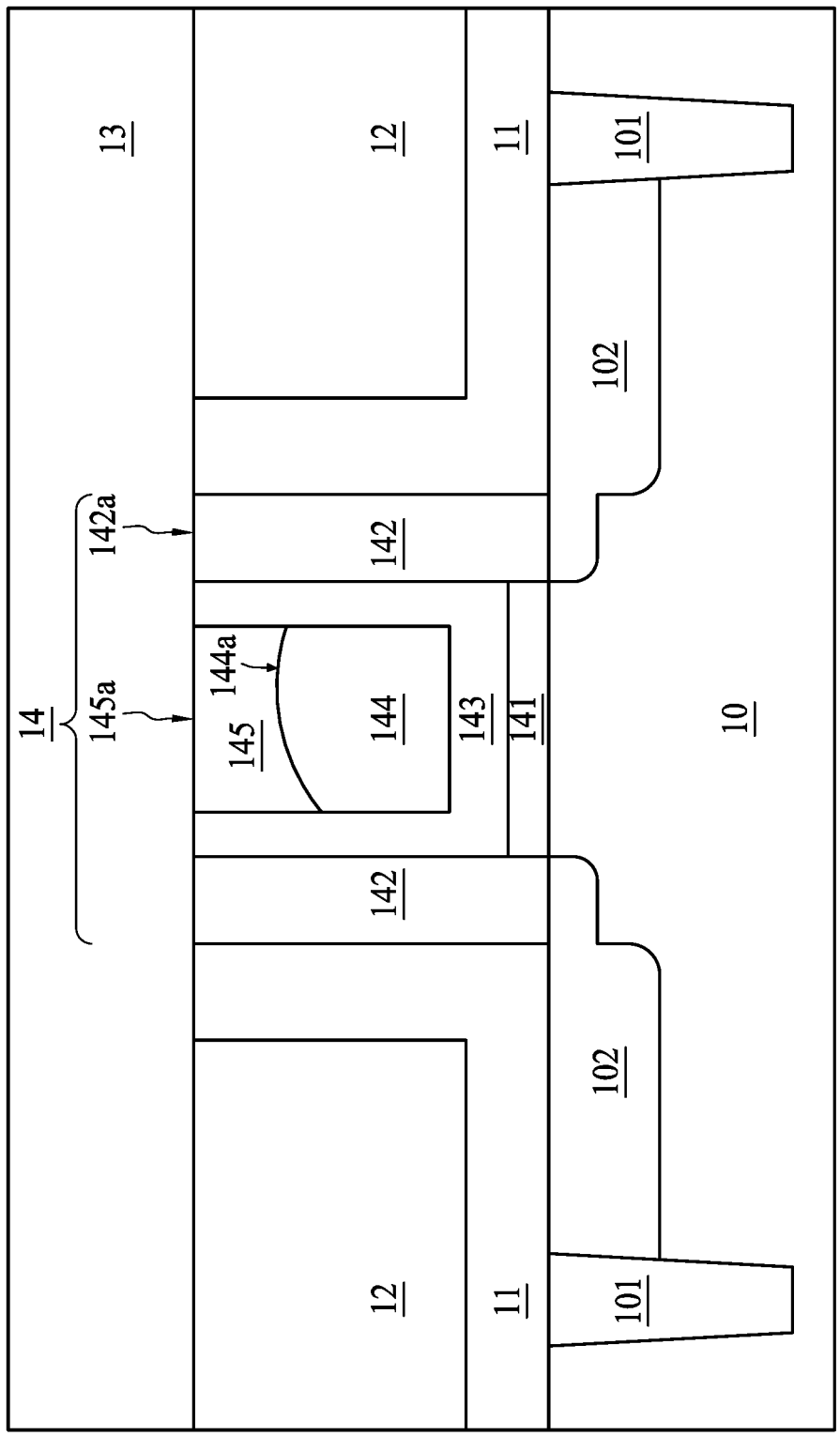

Referring to FIG. 3H, an ILD layer 13 may be formed above the ESL 11, the ILD layer 12 and/or the gate structure 14. The ILD layer 13 may comprise any suitable materials and any suitable thickness. The ILD layer 13 may be formed by any suitable processes, including but not limited to CVD, PVD, ALD and PECVD. In some embodiments, the ILD layer 13 may comprise one or more dielectric materials and/or one or more dielectric layers.

Figure 3I:
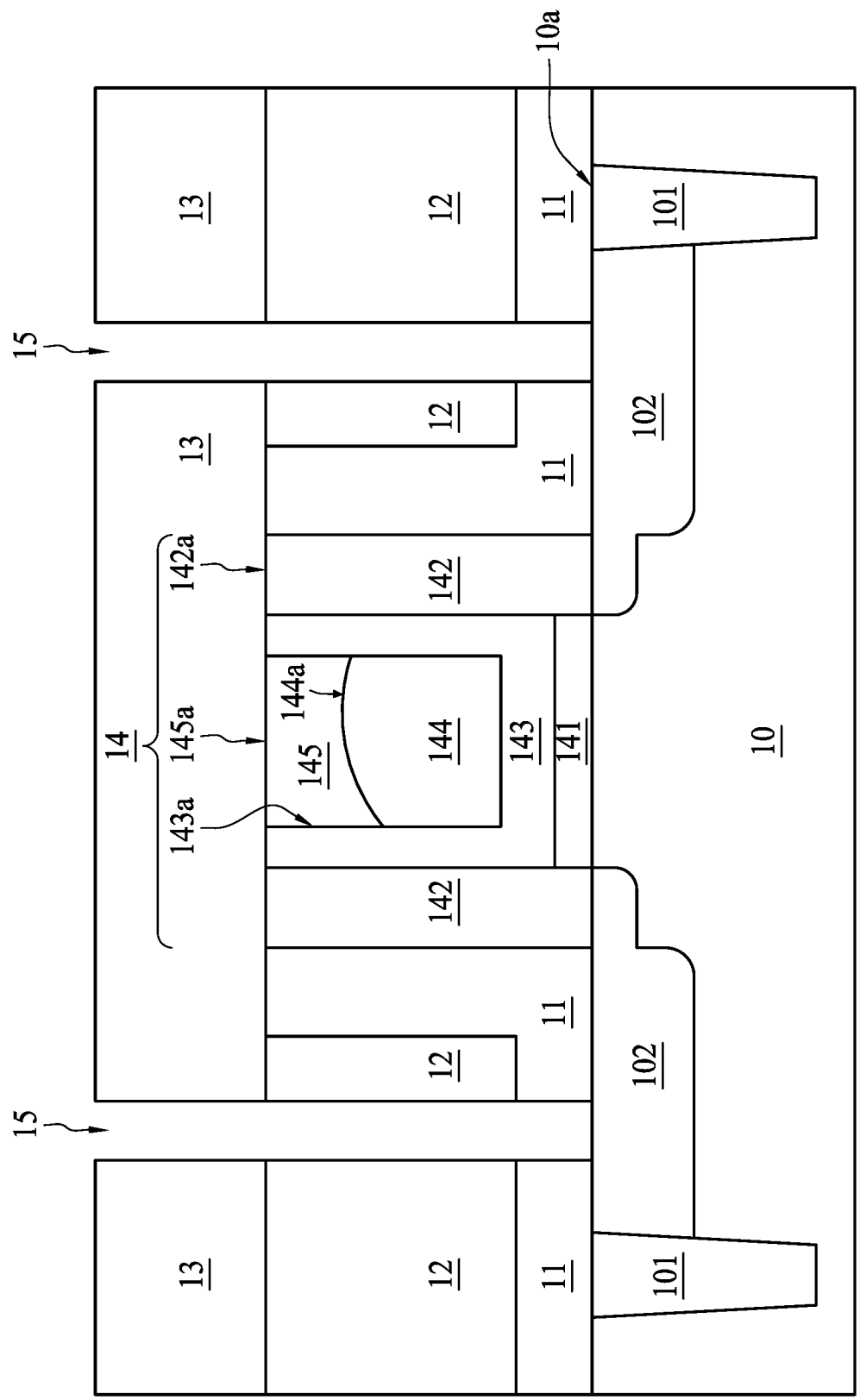

Referring to FIG. 3I, after the formation of the ILD layer 13, at least one opening 15 may be formed so as to expose the source/drain region 102. The opening 15 may be formed by removing a portion of the ESL 11, the ILD layer 12 and/or the ILD layer 13. In some embodiments of the present disclosure, the opening 15 may be formed by etching. In some embodiments, etchants (including but not limited to acids) may be used to clean the opening 15 after the formation thereof.

After the formation of the opening 15, at least one contact 16 may be formed so as to arrive at the semiconductor structure 1 as illustrated in FIG. 1. The contact 16 may electrically connect the source/drain region 102 to circuit elements external to the semiconductor structure 1. The contact 16 may comprise any suitable materials as described herein and may be formed by any suitable processes as described herein. In some embodiments, the contact 16 may comprise one or more materials and/or one or more layers.

In some embodiments of the present disclosure, the semiconductor structure 1 may comprise a gate structure 14 as illustrated in FIG. 2A. The gate structure 14 may comprise the gate dielectric layer 141, the spacer 142, the intermediate layer 143, the metal layer 144 and the protection layer 145. The protection layer 145 may comprise a lateral side 1451, a lateral side 1452 and a middle part 1453. In some embodiments, the thickness of the protection layer 145 at the lateral side 1451 ($D_1$) and/or the thickness of the protection layer 145 at the lateral side 1452 ($D_2$) is greater than the thickness of the protection layer 145 at the middle part 1453.

Since the protection layer 145 of some embodiments of the present disclosure may have a greater thickness at the lateral side 1451 and/or the lateral side 1452 than at the middle part 1453, it is less likely that etchants will etch through the protection layer 145 and reach the metal layer 144, causing undesirable etching of the metal layer 144. In other words, the protection layer 145 of the semiconductor structure 1 of the present disclosure may provide better protection from the etchants to the metal layer 144, resulting in less malfunctioning devices and improved manufacturing yield.

In accordance with one embodiment of the present disclosure, a semiconductor structure includes a first layer having a bottom portion and a sidewall connected to the bottom portion, a metal layer disposed above the bottom portion of the first layer, and a second layer disposed above the metal layer and laterally surrounded by the sidewall of the first layer. The metal layer includes a periphery and a middle portion surrounded by the periphery, the middle portion being thicker than the periphery, and a first etch rate of an etchant with respect to the metal layer is uniform throughout the metal layer and is greater than a second etch rate of the etchant with respect to the second layer.

In accordance with another embodiment of the present disclosure, a semiconductor structure includes a conductive layer having a first lateral side, a second lateral side and a middle portion between the first lateral side and the second lateral side. The semiconductor structure also includes an etch-resistant layer disposed above the conductive layer, and a dielectric layer surrounding the conductive layer and the etch-resistant layer. The conductive layer has an upper surface defined by sidewalls of the dielectric layer. The semiconductor structure further includes a spacer surrounding the conductive layer and the etch-resistant layer, wherein the middle portion is thicker than the first lateral side or the second lateral side.

In accordance with another embodiment of the present disclosure, a semiconductor structure includes a first dielectric layer disposed over a substrate, a second dielectric layer disposed over the first dielectric layer and having a bottom portion and a sidewall over the bottom portion, and a conductive layer disposed above the second dielectric layer, wherein the conductive layer covers an entirety of the bottom portion of the second dielectric layer. The semiconductor structure further includes a protection layer over the conductive layer, wherein the conductive layer separates the protection layer from the bottom portion of the second dielectric layer. The semiconductor structure also includes a spacer disposed over the substrate and laterally surrounding the first dielectric layer, the second dielectric layer, the conductive layer and the protection layer, wherein the conductive layer has a first lateral side, a second lateral side and a central portion between the first lateral side and the second lateral side of the conductive layer, and a first thickness of the central portion is greater than a second thickness of one of the first lateral side and the second lateral side. The protection layer has a third lateral side aligned with the first lateral side of the conductive layer and a fourth lateral side aligned with the second lateral side of the conductive layer, and a thickness sum of the conductive layer and the protection layer at the first lateral side and the third lateral side is substantially equal to a thickness sum of the conductive layer and the protection layer at the second lateral side and the fourth lateral side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a first layer comprising a bottom portion and a sidewall connected to the bottom portion;
    a metal layer disposed above the bottom portion of the first layer; and
    a second layer disposed above the metal layer and laterally surrounded by the sidewall of the first layer,
    wherein the metal layer comprises a first periphery defined by the first layer and a first middle portion surrounded by the first periphery, wherein the second layer comprises a second periphery and a second middle portion aligned with the first periphery the first middle portion, respectively, and a first etch rate of an etchant with respect to the metal layer is uniform throughout the metal layer and is greater than a second etch rate of the etchant with respect to the second layer, wherein a first distance between a first upper surface of the metal layer at the first periphery and a second upper surface of the second layer at the second periphery is greater than a second distance between the first upper surface at the first middle portion and the second upper surface at the second middle portion by an amount between 10% and 500% of the second distance.

2. The semiconductor structure according to claim 1, wherein the second layer is an oxide compound of a material in the metal layer.

3. The semiconductor structure according to claim 1, wherein the second layer comprises at least one of aluminum oxides and tungsten oxides.

4. The semiconductor structure according to claim 1, wherein the first periphery of the metal layer comprises a first lateral side and a second lateral side opposite to the first lateral side, and the first lateral side is thicker than the second lateral side.

5. The semiconductor structure according to claim 4, wherein the first lateral side comprises a thickness between about 200 Å and about 500 Å.

6. The semiconductor structure according to claim 1, wherein the first middle portion of the metal layer comprises a thickness between about 201 Å and about 1000 Å.

7. The semiconductor structure according to claim 1, wherein the second middle portion comprises a thickness less than a thickness of the second periphery.

8. The semiconductor structure according to claim 1, wherein the second periphery comprises a third lateral side and a fourth lateral side opposite the third lateral side, and the third lateral side is thicker than the fourth lateral side.

9. The semiconductor structure according to claim 1, wherein the second middle portion comprises a thickness between about 1 Å and about 100 Å.

10. The semiconductor structure according to claim 1, further comprising a spacer laterally surrounding the metal layer and the second layer.

11. The semiconductor structure according to claim 10, wherein the second upper surface of the second layer is lower than a top surface of the spacer.

12. The semiconductor structure according to claim 10, further comprising a gate dielectric layer below the first layer and laterally surrounded by the spacer.

13. The semiconductor structure according to claim 1, wherein the first layer is contacting the periphery of the metal layer.

14. A semiconductor structure, comprising:
    a conductive layer comprising a first lateral side, a second lateral side and a middle portion between the first lateral side and the second lateral side, the conductive layer comprising a same material across the first lateral side, the middle portion and the second lateral side;
    an etch-resistant layer disposed above the conductive layer;
    a dielectric layer surrounding the conductive layer and the etch-resistant layer, the conductive layer comprising an upper surface defined by sidewalls of the dielectric layer; and
    a spacer surrounding the conductive layer and the etch-resistant layer,
    wherein the middle portion is thicker than the first lateral side or the second lateral side, and a thickness of the conductive layer continually decreases from the middle portion to the first lateral side or the second lateral side.

15. The semiconductor structure according to claim 14, wherein the conductive layer comprises at least one of Al, W, WN, TaN, Ru, TiN, and WCN.

16. The semiconductor structure according to claim 14, wherein the etch-resistant layer comprises a width substantially equal to a width of the top surface of the conductive layer.

17. The semiconductor structure according to claim 14, wherein the etch-resistant layer comprises a bottom surface covering the first lateral side and the second lateral side of the conductive layer.

18. The semiconductor structure according to claim 17, wherein the upper surface of the conductive layer is in contact with the bottom surface of the etch-resistant layer.

19. A semiconductor structure, comprising:
a first dielectric layer disposed over a substrate;
a second dielectric layer disposed over the first dielectric layer and comprising a bottom portion and a sidewall over the bottom portion;
a conductive layer disposed above the second dielectric layer, the conductive layer covering an entirety of the bottom portion of the second dielectric layer;
a protection layer over the conductive layer, the conductive layer separating the protection layer from the bottom portion of the second dielectric layer; and
a spacer disposed over the substrate and laterally surrounding the first dielectric layer, the second dielectric layer, the conductive layer and the protection layer,
wherein the conductive layer comprises a first lateral side facing the second dielectric layer, a second lateral side facing the second dielectric layer, and a central portion between the first lateral side and the second lateral side of the conductive layer, wherein the conductive layer comprises a same material with respect to an etchant across the first lateral side, the central portion and the second lateral side, and a first thickness of the central portion is greater than a second thickness of one of the first lateral side and the second lateral side, wherein the conductive layer has a third thickness continually decreasing from the central portion to the first lateral side or the second lateral side, and
wherein the protection layer comprises a third lateral side aligned with the first lateral side of the conductive layer and a fourth lateral side aligned with the second lateral side of the conductive layer, and a thickness sum of the conductive layer and the protection layer at the first lateral side and the third lateral side is substantially equal to a thickness sum of the conductive layer and the protection layer at the second lateral side and the fourth lateral side.

20. The semiconductor structure according to claim 19, further comprising a source/drain region disposed in the substrate and spaced apart from the conductive layer and the protection layer.

* * * * *